United States Patent [19]
Wolfe

[11] 4,084,095
[45] Apr. 11, 1978

[54] ELECTRON BEAM COLUMN GENERATOR FOR THE FABRICATION OF SEMICONDUCTOR DEVICES

[75] Inventor: John Edmond Wolfe, Escondido, Calif.

[73] Assignee: Burroughs Corporation, Detroit, Mich.

[21] Appl. No.: 768,611

[22] Filed: Feb. 14, 1977

[51] Int. Cl.² .............................................. H01J 37/00
[52] U.S. Cl. ................................. 250/492 A; 250/398
[58] Field of Search .............. 250/398, 492 A, 492 B, 250/396 ML

[56] References Cited
U.S. PATENT DOCUMENTS

| | | |
|---|---|---|
| 3,270,243 | 8/1966 | Kerst ....................................... 250/398 |
| 3,648,048 | 3/1972 | Cahan et al. ....................... 250/492 A |
| 3,699,334 | 10/1972 | Cohen et al. ........................... 250/398 |
| 3,872,305 | 3/1975 | Koike ..................................... 250/398 |

*Primary Examiner*—Bruce C. Anderson
*Attorney, Agent, or Firm*—Mervyn L. Young; Kevin R. Peterson

[57] ABSTRACT

This disclosure relates to an electron beam generator and focusing mechanism including a high current thermionic field emission source to establish a high current electron beam and an electro-magnetic focusing means placed along the axis of the electron beam between the source and the target so as to provide a large image focal distance with the electron beam source being formed of a tungsten cathode which is coated with zirconium.

12 Claims, 5 Drawing Figures

ELECTRON BEAM COLUMN GENERATOR FOR THE FABRICATION OF SEMICONDUCTOR DEVICES

BACKGROUND OF THE INVENTION

1. Field of Invention

The present invention relates to an electron beam generator and more particularly to such a generator for employment in the fabrication of semiconductor devices.

2. Description of Prior Art

Integrated circuits are created of different active elements fabricated within or on the surface of a crystalline substrate. This fabrication is accomplished by a series of processes for forming areas of different conductivities, in or on the surface of the substrate by the diffusion of impurity atoms into those areas so as to form the active elements. In addition to diffusion, ion implant and epitaxial growth are the standard methods of creating such active elements.

The formation of such an integrated circuit chip and a number of such chips in a crystalline wafer require a number of process steps such as masking the crystalline surface and exposing only those areas in which impurity atoms are to be diffused or implanted or epitaxial areas are to be grown, covering such areas with an insulating or oxide material and so on. In each of these steps, the pattern to be formed is created by covering the surface of the crystalline wafer with a photo resist material and optically exposing that surface through a mask containing the pattern to be created. Such masks are in turn created by drawing the pattern on an enlarged scale and photographically reducing it to the size of the elements which are to be formed in the integrated circuit chip.

The active elements which can be formed in an integrated circuit chip by the above described processes generally are not any smaller than 2 microns in dimension and it is believed that the resolution that can be obtained by such optical lithography processes has reached its limit. Electron beam lithography methods have been employed to achieve higher resolution but have not been greatly successful because of the time involved to generate the patterns due to the low intensity of the electron beam which requires long exposure times for the electron beam resist material employed.

An additional disadvantage of prior art electron beam generators is that the focusing lens was placed relatively close to the target which allowed for faster scanning of the target but only over a relatively small area. Thus, the scan cycle had to be repeated many times in order to cover the entire target area.

With a sufficiently improved electron beam column having a high beam current density and a large image focal length, the entire target chip area can be scanned and the pattern, to be imposed thereon, generated much faster than with prior art electron beam generators. Furthermore, not only can such an electron beam generator be employed to form high resolution masks for use in integrated circuit fabrication but the respective steps of masking can be eliminated and the pattern can be generated directly on the surface of the integrated circuit wafer.

It is, then, an object of the present invention to provide an improved electron beam generator.

It is still another object of the present invention to provide an electron beam generator for employment in semiconductor manufacture which generator produces beams of high current densities.

It is still another object of the present invention to provide an electron beam generator having a focusing mechanism so arranged as to provide a large image focal distance to accomodate the scanning of larger target areas.

SUMMARY OF THE INVENTION

In order to accomplish the above objects, the present invention resides in an electron beam column and focusing mechanism to provide a very high current electron beam and also wide deflection of the beam. To this end, the electron beam generator employs a thermionic field emission source having a cathode formed of tungsten with oxygen interstices and the tip of which cathode is coated with zirconium. Such a cathode can generate an electron beam current of 1,000 amperes per square centimeter. Electromagnetic focusing means are employed which have low values of aberration coefficients to further promote high beam current and the focusing means is constructed to provide a very large image focal distance relative to the object focal distance. Because of the very large image focal distance, a small angular deflection of the beam close to the focusing mechanism provides for a large deflection of the beam at the target source.

A feature then in the present invention resides in electron beam generator and focusing mechanism including a high current thermionic field emission source to establish a high current electron beam and an electromagnetic focusing means placed along the axis of the electron beam between the source and the target so as to provide a large image focal distance with the electron beam source being formed of a tungsten cathode which is coated with zirconium.

DESCRIPTION OF THE DRAWINGS

The above and other objects, advantages and features of the present invention will become more readily apparent from a review of the following specification when taken in conjunction with the drawings wherein.

GENERAL DESCRIPTION OF THE INVENTION

Figure 1:
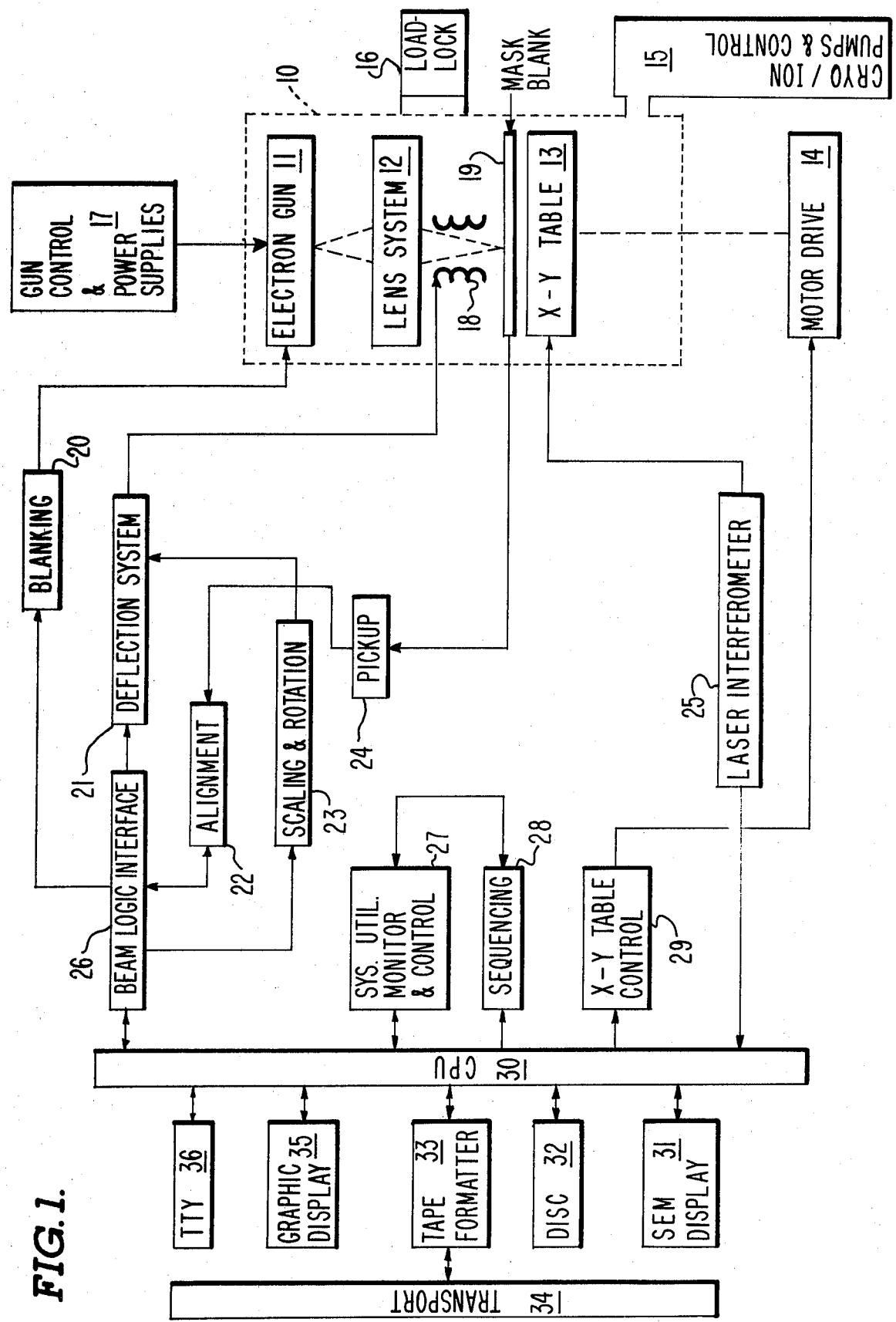
FIG. 1 is a diagram of a system employing the present invention.

As was indicated above, a system employing the present invention is designed to not only create high resolution masks for employment in integrated circuit fabrication but also for direct employment in such fabrication. Such a system is illustrated in FIG. 1 along with its respective controls. With reference to that Figure, lithography system 10 includes electron gun 11 to form an electron beam which is focused by lens system 12 upon mask blank 19. Mask blank 19 is supported by X-Y table 13 which is positioned by motor drive 14 outside of the system. The electron beam column formed by electron gun 11 and lens system 12 also includes deflection means 18 and electron gun control and power supplies 17. Vacuum is maintained in the lithography system chamber 10 by pumps and control 15.

Control of lithography system 10 is provided by central processor 30 under program control. Central processor 30 in turn is provided with various input/output devices and an interface with the system which will only be briefly described. In order to control the pattern generation by the electron beam column, central processor 30 drives beam logic interface 26 that activates blanking unit 20 to control the variation in the electron beam intensity of electron gun 11. Beam logic interface 26 also activates deflection system 21 both directly and also by way of scaling and rotation unit 23 to vary the current in deflection coils 18 so as to deflect the electron beam to its required position on the target area which in the case of FIG. 1 is mask blank 19. The amount of beam deflection required of deflection system 21 is dependent upon the alignment of mask blank 19 which alignment is detected by pickup unit 24 that in turn signals beam interface logic 26 by way of alignment unit 22.

Positioning of mask blank 19 is accomplished by positioning X-Y table 13. The position of X-Y table 13 is detected by laser interferometer 25 that in turn signals central processor 30. In response thereto, X-Y table control 29 positions X-Y table 13.

The remaining elements of the control system illustrated in FIG. 1 are associated with the central processor 30. These include the systems utility monitor and control 27 and related sequencing unit 28. Also associated with central processor 30 are a plurality of peripheral devices such as teletype unit 36 which may be used by the operator to input information to the central processor 30, graphic display 35, tape transport 34 which is coupled to central processor 30 by way of tape formatter 33, disk unit 32 and a scanning electron microscope display 31.

Figure 2:
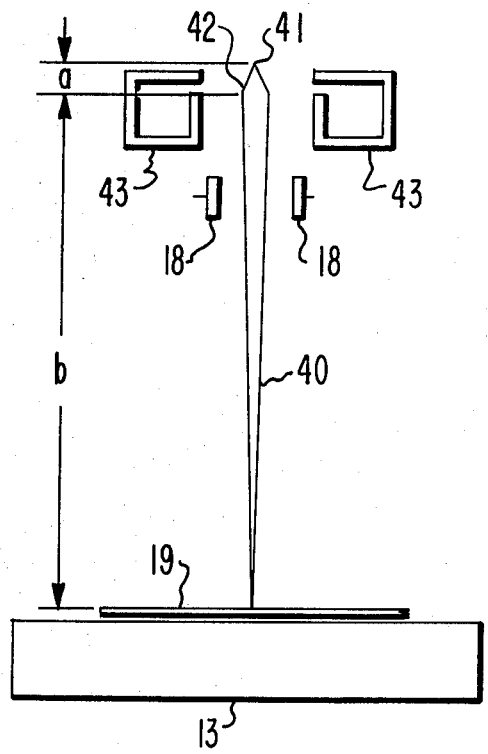
FIG. 2 is an elevational view of the present invention.

An embodiment of the present invention is the electron beam column illustrated generally in FIG. 2. This column is formed of a thermionic-field emission source including point cathode 41 and anode 42 which accelerates electron beam 40 through a magnetic field created by magnetic lens 43 to focus the beam upon target 19. As has been indicated above, target 19 may be either a sensitive mask film or a sensitized surface on an integrated circuit wafer. Deflection plates or coils 18 (preferably coils) are provided as was discussed in relation to FIG. 1 to deflect the focused beam to various locations on target 19.

The electron beam column of FIG. 2 is characterized by cathode 41 being capable of providing a high electron beam current and magnetic lens 43 being capable of forming a large image focal distance, $b$, relative to the object focal distance, $a$. In the present invention, image focal distance $b$, is preferably 10 times the object focal distance, $a$.

DETAILED DESCRIPTION OF THE INVENTION

Figure 3:
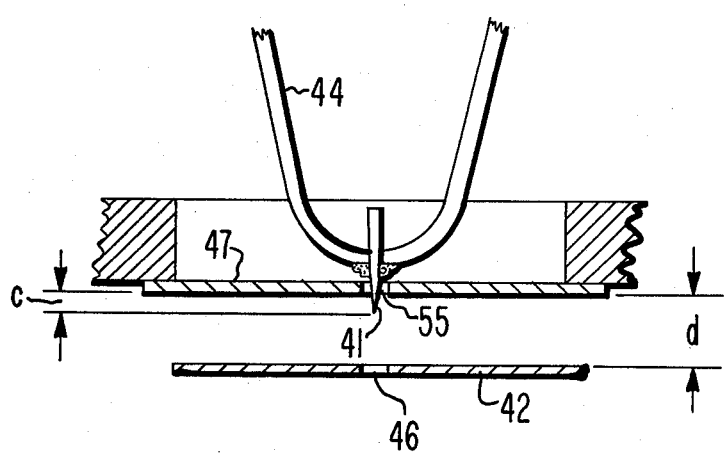
FIG. 3 is an elevational view of an electron beam source as employed in the present invention.

The thermionic-field emission source employed in the present invention will now be described in relation to FIG. 3. This source includes a cathode needle 41 that is formed of single crystal tungsten with axial <100> orientation. Cathode needle 41 extends forward through grid electrode 47 which shields hairpin filament 44 to which cathode needle 41 is attached. The tip of cathode needle 41 is coated with zirconium by a manner which is described in the Wolfe et al. U.S. Pat. No. 3,814,975. Other methods of applying zirconium are disclosed in the Charbonnier et al. U.S. Pat. No. 3,374,386. Anode electrode 42 is spaced from grid electrode 47 by about 30 mils and is provided with aperture 46 to allow the accelerated electron beam to pass therethrough. The voltages supplied to cathode needle 41 and anode 42 are such as to create an electric field of approximately $10^7$ volts per centimeter. In operation, filament 44 is heated to a temperature of approximately 1800° K.

Figure 4:
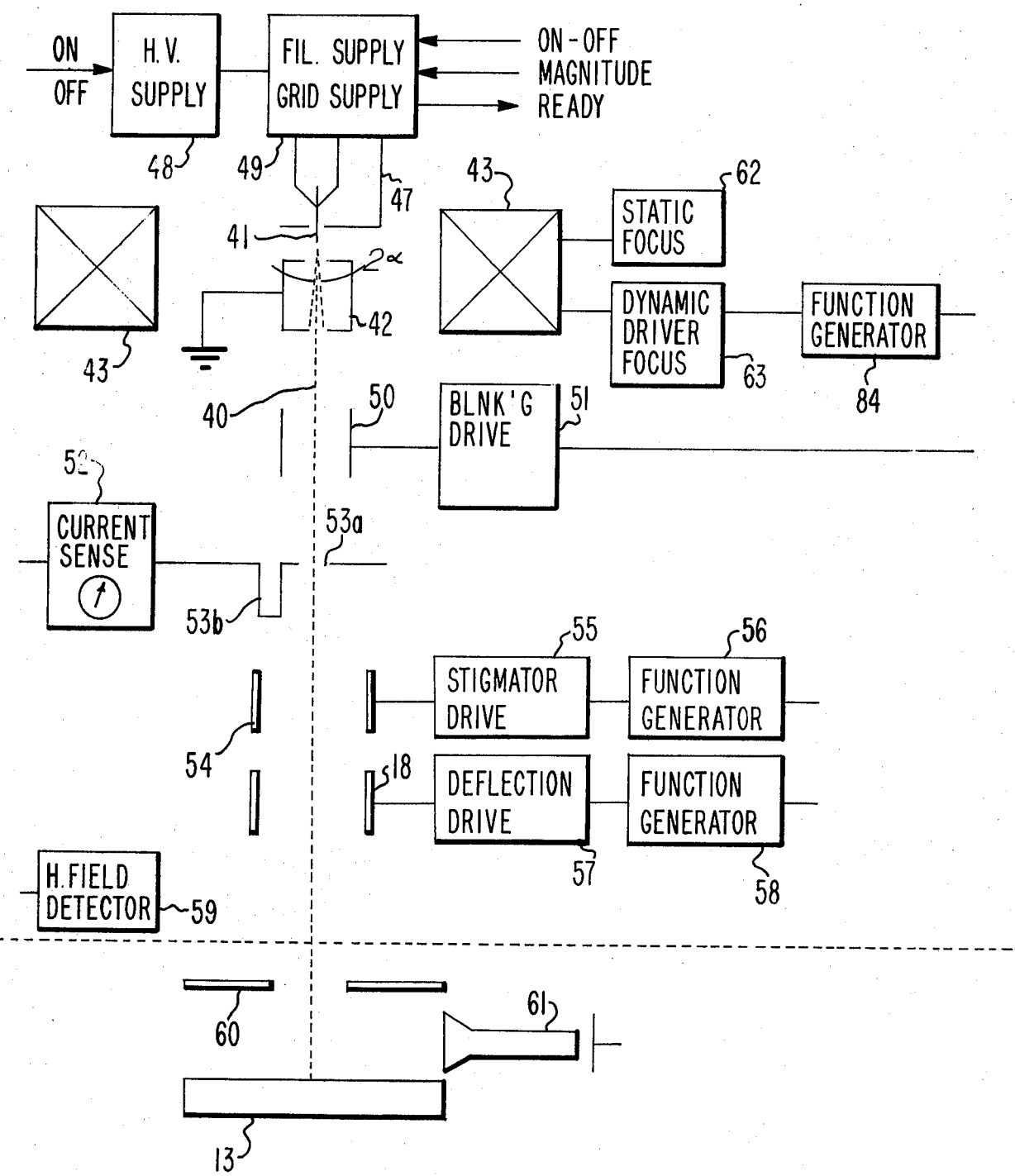
FIG. 4 is a schematic diagram of the circuitry employed with the present invention.

FIG. 4 illustrates the electrically functional components and related circuitry which are provided for the operation of the electron beam column of the present invention. As shown therein, the electron gun which includes cathode 41 and grid 47 is coupled to filament supply and grid supply 49 for the heating of the cathode filament and provision of a grid voltage. Filament and grid supply unit 49 is coupled to high voltage power supply 48 which contains a current limiter for limiting current in the case of an accidental arc in the electron gun. The filament current supply also contains a servo control for the electron beam current. High voltage power supply 48 provides a very well regulated (50 parts per million per hour) −10KV, relative to ground, to the filament supply which in turn conveys this potential to the gun cathode. As illustrated in FIG. 4, anode 42 is at ground potential.

Focus coil 43 provides the lens action and is positioned relatively close to cathode 41 so as to image the extremely small virtual source of electrons with considerable magnification onto an electron resist coated sample mounted on X-Y table 13. A very well current regulated (10 parts per million per hour) static focus power supply 62, which includes manual current control, will provide static focus capability. Dynamic focus capability is provided by dynamic focus current supply 63 for employment in the case where greater than ± 3mm sweep capability of the electron beam is desired. Dynamic focus current supply 63 and its corresponding function generator 64 drive a separate coil in magnetic lens 43.

Blanking of the electron beam is provided by blanking plates 50 to deflect the electron beam off of aperture 53a into a Faraday cup 53b. In addition to the blanking of the electron beam, this action provides a convenient method of monitoring beam current by measuring the current entering Faraday cup 53b. Current sense circuitry 52 is provided for this purpose. The value of beam current may also be used to provide a feedback signal to the filament current supply 49 so as to automatically adjust and maintain a desired value of the beam current. Blanking drive unit 51 is adapted to provide 1 nano-second rise and fall time for blanking deflection plates 50.

As indicated in FIG. 4, the electron beam column is provided with stigmator coils 54 and stigmator drive means 55 the latter of which provides both a static component signal and a dynamic signal under the control of function generator 56. Dynamic stigmation will normally only be needed for electron beam sweeps greater than ± 3mm.

Deflection coils 18 provide X and Y deflection and are driven by deflection drivers 57 under the control of function generator 58. Deflection drivers 57 receive current feedback (not shown) for the purpose of extreme linearity. Inherent sin-tan non-linearity is corrected by function generator 58. Solid state detector 60 is provided to detect reflected primary electrons from the target and electron multiplier 61 is provided for detecting secondary electrons. Magnetic field detector 59 provides a corrective input signal to the X and Y sweep circuits to correct for residual a.c. magnetic field variation in the column vicinity.

In a preferred embodiment of the invention and the system in which it is employed, the cathode voltage is 10KV and the beam current is 1 microampere for a target image of 0.25 micrometer in diameter or 1.6 microamperes for a target image of 0.5 micrometer in diameter. The sweep rate provided by the deflection plates is 12,500 scans per second for a scan length of ± 3 millimeters. The rate at which the electron beam is blanked to generate a pattern is 150 megahertz.

The cathode needle as described above has a predicted lifetime of approximately 1,000 hours for the current densities employed. The cathode radius at its tip is approximately 0.6 microns to provide a virtual source which is imaged with magnification by the magnetic lens onto the target to provide about 24,000 spot diameters of deflection at the target with about 1° angular deflection. Such low angular deflections are very helpful relative to sweep non-linearities and other aberrations.

The magnetic lens, described above, is operated with a short focal length relative to the lens diameter where the focal length of the system is almost the same as the object focal distance. With a large inside diameter, the object focal distance, $a$, may be from 0.5 inches to 1 inch and the image focal distance, $b$, may be from 4 to 16 inches. As was stated above, the preferred ratio of $b$ to $a$ is 10. When such a magnetic lens with a short object focal distance relative to the lens diameter is employed, very low spherical aberration and chromatic aberration coefficients are obtained allowing relatively low energy electrons to be used while still providing a high beam current. The high beam current results from both the high brightness cathode and the large aperture angle which can be accomodated by the magnetic lens without severe spherical aberration.

Figure 5:
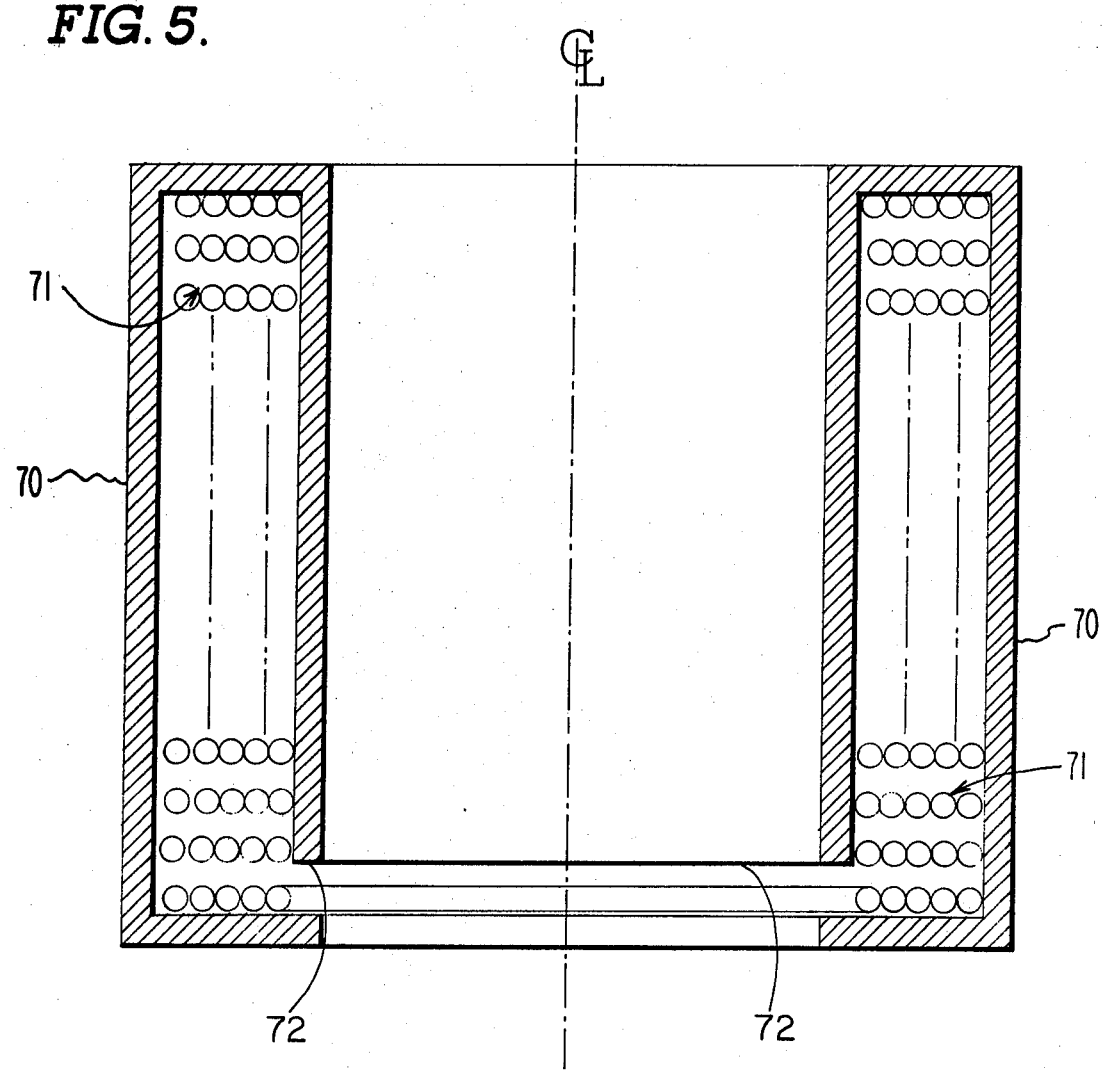
FIG. 5 is a cross-sectional view of the focusing mechanism of the present invention.

A physical embodiment of the magnetic focusing mechanism of the present invention is illustrated in FIG. 5. As shown therein, this mechanism includes a soft iron annular shell 70 which houses electrically conductive windings 71. The magnetic field which actually focuses the electron beam is created across gap 72 in shell 70. To produce a long image focal distance with low aberration for a given object focal distance, the lens must have a large inside diameter. In addition, the magnetic gap must not be too small or excessive ampere turns will be required to generate a magnetic field of the appropriate strength. In FIG. 5, the inside diameter of shell 70 is 4 inches while gap 72 is 0.5 inches in width.

The principal plane of the equilvalent thin lens created by the magnetic field is approximately 1.4 inches toward the target from the center of the magnetic gap of the focusing mechanism. To achieve this, electron source 41 (see FIGS. 2 and 3) is positioned near the focal point with its tip approximately 0.4 inch toward the target from the gap center line. The virtual object is approximately at the tip of the electron source and one inch behind the principal plane with relation to the target so as to provide an object focal distance of one inch. Thus, the focusing mechanism of FIGS. 2 and 5 is designed for a one inch object focal distance and a magnification at about ten. This requires that excitation parameter $K = 1000$, where $K = (NI)^2/V$; $NI$ is the magnetomotive force in ampere turns and $V$ is the acceleration potential of the electron beam, which is approximately 10 KV. $K$ must be increased as the lens diameter increases to maintain sufficient magnetic field strength at the electron beam path.

Under the above circumstances, the spherical aberration coefficient $C_s$ is 0.32 inches and the chromatic aberration coefficient $C_c$ is 0.62 inches. (For the calculations of spherical aberration and chromatic aberration, see J.R.A. Cleaver, "Field Emission Guns for Electron Probe Instruments", *International Journal of Electronics*, 1975, Volume 38, Number 4, Pages 513-529. See also El-Kareh and El-Kareh, *Electron Beam, Lens and Optics*, Volume 2, Academic Press, 1970, Pages 58 and 270-290 respectively).

With the embodiment described in the present application, the collection half angle, $\alpha$, of the electron beam is 0.015 radians at the emitter of the electron gun as determined by an aperture such as shown in FIG. 4. This angle is defined as the angle between the beam axis and the outer ray of the beam as indicated in FIG. 4. With the above described values, the diameter of the spherical aberration disk, $d_s$, and the chromatic aberration disk diameter, $d_c$, may be calculated as $$d_s = C_s \alpha^3 / 2$$

$$d_c = C_c \Delta V \alpha / V$$

(See Cleaver, supra) and the values obtained thereby are $d_s = 137$ A and $d_c = 118$ A. The virtual crossover for this electron gun is about 100 A. Summing these diameters in quadrature $$d = \sqrt{(118)^2 + (137)^2 + (100)^2}$$

$$= 206 \text{ A}$$

where $d$ is the virtual source size. With a magnification of 10, the image size becomes 0.206 micrometers. This value may be adjusted to larger sizes by increasing the collection half angle, $\alpha$, thereby changing $d_s$ and $d_c$ and, hence, $d$, the virtual source size.

With the embodiment of the focusing mechanism as described above, the inside diameter of the focusing mechanism is to be as large as possible without being so large as to weaken the magnetic field created by that number of ampere turns as employed in the embodiment of the magnetic coil as described. The ratio of the spherical aberration coefficient to the object focal distance, $C_s/f_o$, should be less than 0.4. The ratio of the object focal distance to the lens diameter should be less than 0.35 and, with the embodiment of the present invention, is 0.25. With the focusing mechanism as thus described, magnification of at least 10 is obtained to provide submicron spot sizes at the target as was indicated above.

Because of the high current density of the electron beam column of the present invention, not all of the current available is required for integrated circuit microfabrication. Because of the excess current availability, the aperture angle on the gunside of the lens may be reduced to accomplish a reduction in the beam current striking the target. This in turn allows for the reduction of aberrations of the lens and the deflection system.

The mechanical stage which holds the target (X-Y stage 13 in FIGS. 1, 2 and 4) may be used either to step from one electronically scanned area to another or continuously employed to provide one direction of mechanical scan with the electron beam scanning in a direction perpendicular to the mechanical scan. The laser interferometer mechanical stage positioning measurement is used to correct for errors in mechanical positioning by using the error signal to control the electron beam position in such a way as to cancel errors.

By exposing the electron beam resist material (which either costs a mask or a circuit wafer itself) to very rapid exposure compared to prior art systems, the entire mask or wafer can be exposed before long time drift errors reach objectional values. In the use of masks, only one preexposure alignment operation need be performed and no interruptions of exposure are necessary for realignment due to drift as encountered in prior art machines. Production of integrated circuit wafers by direct exposure without the employment of any masks is more practical with the present invention because of the superior exposure speed.

EPILOGUE

An electron beam column and focusing mechanism have been described above which provide a very high current electron beam and also wide deflection of the beam. Thus, faster scanning of a target is obtained than has been provided in the prior art. The source of the electron beam includes a cathode that can generate an electron beam current of 1000 amperes per square centimeter which, in turn, accomodates the employment of an electro-magnetic focusing means which has low values of aberration coefficients and also provides a very large image focal distance.

While, but one embodiment of the present invention has been disclosed, it will be apparent to those skilled in the art that variations and modifications may be made therein without departing from the spirit and the scope of the invention as claimed.

What is claimed is:

1. A system for exposing a sensitized surface to a variable electron beam, said system comprising;
   a target positioning means to hold said sensitized surface;
   an electron beam source means to generate a high current electron beam along the path to said target positioning means;
   an electric potential means mounted along said path to accelerate said beam towards said target positioning means; and
   a magnetic focusing means mounted along said path between said electron beam source means and said target positioning means so as to provide an image focal distance longer than the related object focal distance, said focusing means including electro-magnetic means to provide sufficient magnetomotive force to focus said beam on a sensitized surface at said target positioning means.

2. A system as claimed in claim 1 wherein said target positioning means holds a masking material having a sensitized surface.

3. A system according to claim 1 wherein said target positioning means holds a crystalline wafer having a sensitized surface.

4. A system for exposing a sensitized surface to a variable electron beam, that system comprising;
   a target positioning means to hold said sensitized surface;
   an electron beam source means to generate an electron beam along the path to said target positioning means to provide a current density at said sensitized surface of the order of 1,000 amperes per square centimeter;
   electric potential means mounted along said path to accelerate said beam towards said target positioning means; and
   magnetic focusing means mounted along said path between said electron beam source means and said target positioning means so as to provide an image focal distance longer than the related object focal distance, said focusing means including electromagnetic means to provide sufficient magnetomotive force to focus said beams on said sensitized surface at said target positioning means.

5. A system according to claim 4 wherein:
   said electron beam source means includes a tungsten needle which is coated with zirconium.

6. A system according to claim 5 wherein:
   said tungsten needle is formed of a single crystal tungsten.

7. A system according to claim 4 wherein:
   the ratio of the square of the magnetomotive force of said electromagetic means to the potential of said electric potential means is of sufficient magnitude to provide an image focal distance of approximately ten times the related object focal distance.

8. A system according to claim 4 wherein:
   said electro-magnetic means includes an annular shell having an internal diameter sufficiently large to provide a small coefficient of spherical aberration.

9. A system according to claim 8 wherein:
   the ratio of the spherical aberration coefficient to the object focal distance is less than 0.4 and the ratio of the object focal distance to the internal diameter of the electro-magnetic means is less than 0.35.

10. A system for exposing a sensitized surface to a variable electron beam, said system comprising;
    a target positioning means to hold said sensitized surface;
    an electron beam source means to generate a high current electron beam along the path to said target positioning means;
    an electric potential means mounted along said path to accelerate said beam towards said target positioning means; and
    a magnetic focusing means mounted along said path between said electron beam source means and said target positioning means, said focusing means including electro-magnetic means to provide sufficient magnetomotive force to focus said beam on a sensitized surface at said target positioning means whereby the ratio of the square of the magnetomotive force of said electromagnetic means to the potential of said electric potential means is of sufficient magnitude to provide an image focal distance of an order of magnitude larger than the related object focal distance.

11. A system according to claim 10 wherein said electromagnetic means includes an annular shell having an internal diameter sufficiently large to provide a small coefficient of spherical aberration.

12. A system according to claim 11 wherein the ratio of the spherical aberration coefficient to the object focal distance is less than 0.4 and the ratio of the object focal distance to the internal diameter of the electromagnetic means is less than 0.35.

* * * * *